United States Patent [19]

Brun et al.

[11] 4,247,834

[45] Jan. 27, 1981

[54] CONTROL CIRCUIT FOR ESTABLISHING VOLTAGE-CONTROLLED OR INJECTION-LOCKED OPERATION OF A SYNTHESIZER REFERENCE OSCILLATOR

[75] Inventors: Craig W. Brun, Honeoye Falls; Wilfred L. Hand, Clarence, both of N.Y.

[73] Assignee: GTE Products Corporation, Stamford, Conn.

[21] Appl. No.: 12,258

[22] Filed: Feb. 15, 1979

[51] Int. Cl.³ .................... H03L 7/00; H03L 7/24
[52] U.S. Cl. .................................... 331/172; 331/1 R
[58] Field of Search ............... 331/1 R, 10, 16, 18, 331/172

[56] References Cited

U.S. PATENT DOCUMENTS

| | | |
|---|---|---|
| 3,304,518 | 2/1967 | Mackey .................... 331/172 X |
| 3,534,284 | 10/1970 | Beurrier .................... 331/10 |
| 3,534,285 | 10/1970 | Kobold et al. ............. 331/10 |

*Primary Examiner*—Siegfried H. Grimm
*Attorney, Agent, or Firm*—John A. Odozynski

[57] ABSTRACT

In a synthesizer system having a reference oscillator selectively operable in either a voltage-controlled or an injection-locked mode, a circuit for effecting the appropriate mode of operation. The circuit includes an analog gate coupled between the output of a crystal oscillator and the input of the reference oscillator. The analog gate is driven by a logic element responsive to a plurality of signals indicative of specific operating conditions. In particular, the circuit assures that the reference oscillator is coupled to the crystal oscillator, that is, the reference oscillator operates in the injection locked mode, while the synthesizer PLL achieves acquisition.

18 Claims, 1 Drawing Figure

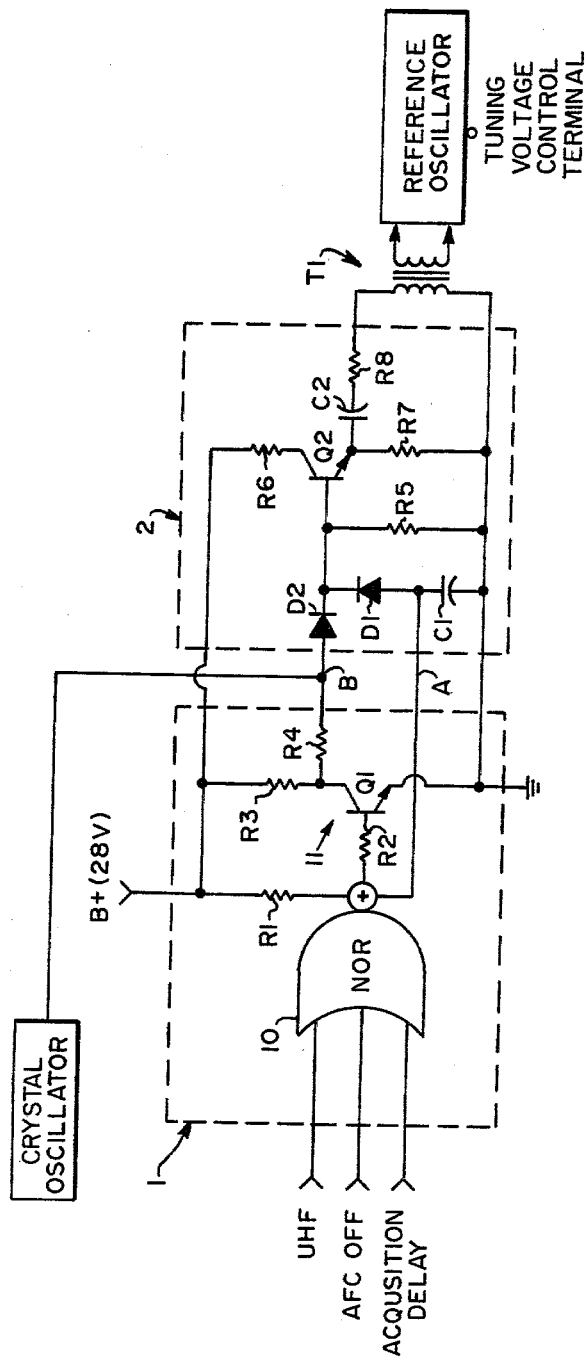

4,247,834

CONTROL CIRCUIT FOR ESTABLISHING VOLTAGE-CONTROLLED OR INJECTION-LOCKED OPERATION OF A SYNTHESIZER REFERENCE OSCILLATOR

TECHNICAL FIELD

This invention relates to frequency synthesizers and more particularly to a control circuit for effecting reference oscillator operation in either a voltage-controlled mode or in an injection-locked mode. In the injection-locked mode the reference oscillator is coupled to a crystal oscillator and the reference frequency is made equal to the frequency of the crystal oscillator.

BACKGROUND ART

United States Patent Application, Ser. No. 956,955, filed Nov. 2, 1978 by the same inventors and assigned to the same assignee as this application, and hereby incorporated by reference, describes a synthesized local oscillator for a television receiver. The synthesizer reference oscillator described therein is selectively capable of operating in either a voltage-controlled mode whereby its operating frequency is determined by the voltage-applied to its tuning voltage control terminal or in an injection-locked mode whereby the reference oscillator is coupled to a crystal oscillator and its operating frequency is rendered equal to the frequency of the crystal oscillator.

Voltage-controlled operation of the reference oscillator is desirable when the receiver is operating from sources, such as some MATV and CATV systems as well as home video games, that provide nonstandard carrier signal frequencies. In this mode of operation the tuning voltage may be provided either by the AFC circuitry conventionally included in the receiver or by a manually variable FINE TUNE circuit. In either event the reference oscillator operating frequency will be continuously variable so as to accommodate the particular carrier frequency encountered. However, crystal-controlled operation of the reference oscillator is desirable when receiving carrier signals at the FCC-specified frequencies. In addition, even when operating in the voltage-controlled mode, it is desirable to maintain momentary crystal-controlled operation while the synthesizer phase-locked loop (PLL) is undergoing loop acquisition. This may occur when, for example, the viewer makes a channel selection or changes the source of tuning voltage from the FINE TUNE circuit to the AFC circuitry. In the manner described hereinafter, the subject invention comprises a control circuit for selectively effecting reference oscillator operation in the appropriate, that is, either voltage-controlled or injection-locked, mode.

DISCLOSURE OF THE INVENTION

This invention is a control circuit for a synthesizer reference oscillator that is selectively capable of operation either in an injection-locked mode wherein the reference oscillator operating frequency is determined by the frequency of a crystal-controlled oscillator or in a voltage-controlled mode wherein the reference oscillator operating frequency is determined by the voltage applied to a tuning voltage control terminal. The control circuit comprises a logic element having an input coupled to a signal source determinative of the reference oscillator mode of operation. The circuit also comprises an analog gate coupled to the crystal-controlled oscillator and driven by the logic element for selectively coupling the crystal-controlled oscillator to the reference oscillator to establish the injection-locked mode and for isolating the crystal-controlled oscillator from the reference oscillator to establish the voltage controlled mode.

In addition to assuring a voltage-controlled, and therefore continuously variable, reference oscillator frequency during the reception of carrier signals at nonstandard frequencies, the control circuit assures a crystal-controlled reference oscillator frequency during the time required for the synthesizer PLL to achieve acquisition.

BRIEF DESCRIPTION OF THE DRAWING

The sole drawing is a schematic diagram of the subject control circuit for establishing voltage-controlled or rejection-locked operation of a synthesizer reference oscillator.

BEST MODE OF CARRYING OUT THE INVENTION

Referring now to the drawing, the subject control circuit includes a logic element 1 having a first output A coupled to a first input of an analog gate 2. The logic element has a second output B coupled to a second input of the analog gate; the second input of the analog gate is also coupled to a 4 MHz crystal-controlled oscillator. The output of the analog gate is coupled by a transformer T1 to the synthesizer reference oscillator. (The structure and operation of the synthesizer system albeit not essential to an understanding of this invention, are detailed in the patent application cited above). The logic element comprises multiple-input, "open-collector" type NOR gate having an output pulled up to a 28-volt supply B+, through a resistor R1. The inputs of the NOR gate are coupled to signals respectively designated "UHF", "AFC OFF" and "ACQUISITION DELAY". The voltage at the UHF input will be at a logic ONE level whenever the television receiver is operating on a UHF channel. The voltage at the "AFC OFF" input will be at a logic ONE level whenever, for example, the viewer places a similarly designated switch in such a position, thereby disconnecting the reference oscillator tuning control terminal from the AFC circuitry and, in effect, establishing injection-locked operation. The voltage at the ACQUISITION DELAY input will be at a logic ONE level whenever it is expected, or established in fact, that the synthesizer PLL is in an out-of-lock condition. During this time it is desired that the reference oscillator be locked to the crystal oscillator, thereby providing a stable and reasonably accurate output frequency. However, once the PLL has achieved acquisition, the reference oscillator frequency may again be established by a tuning voltage derived from either the AFC or the FINE TUNE circuitry. This invention is compatible with an ACQUISITION DELAY signal that may be derived from a variety of sources. For example, the application cited above describes an ACQUISITION DELAY circuit that generates a voltage pulse of appropriate duration whenever a CHANNEL ENTER button is depressed or a FINE TUNE switch switched from an ON to OFF condition. The circuit in effect presupposes the PLL to be in an out-of-lock condition and the momentary pulse assures that the reference oscillator is injection-locked to the crystal oscillator, thereby circumventing transient effects that subsist while the loop is achieving acquisition. Alternatively, some commercially available integrated PLL's contain circuits that detect and indicate locked or out-of-lock loop. Where such circuitry is available the ACQUISITION DELAY signal can be conveniently derived from this source. The logic element also includes an inverter 11 in the form of a transistor Q1 having an input (base) coupled through a resistor R2 to the output of the NOR gate. Q1 has a collector coupled through a resistor R3 to B+ and an emitter coupled to ground. The output of the inverter is coupled through a resistor R4 to an input of the analog gate. Whenever any input of the NOR gate is at a logic ONE level, its output will be at a logic ZERO, the output of the inverter will be at a logic ONE level and, as described below, the crystal oscillator will be coupled through the analog gate and T1 to the reference oscillator.

The analog gate has a first input, at the anode of a first diode D1, coupled to the A output of the logic element, the output of NOR gate 10. The analog gate has a second input, at the anode of a second diode D2, coupled to both the B output of the logic element, the output of inverter 11, and to the crystal-controlled oscillator.

The cathodes of D1 and D2 are coupled in common to the base of a transistor Q2 and through a resistor R5 to ground. Q2 has a collector coupled through a resistor R6 to B+ and an emitter coupled through a resistor R7 to ground. The emitter of Q2 is coupled through a series-connected capacitor C2 and resistor R8 to the primary of T1, thereby providing the output of the analog gate at that point. C2 is an AC coupling capacitor and represents a negligibly small impedance at the crystal oscillator frequency, 4 MHz in this embodiment. R8 preserves the selectivity of T1, which would be otherwise damped by the low impedance at the emitter of Q2. This is desirable because, although not specifically indicated in the drawing, the secondary of T1 forms the inductive element in the reference oscillator tank circuit. The anode of D1 is coupled through an RF bypass capacitor C1 to ground, thereby preventing components of the 4 MHz crystal oscillator signal from reaching T1 when D1 is conducting.

Operation of the control circuit is as follows. When any input to the NOR gate is at a logic ONE level, its output will be pulled to ground and Q1 will be consequently cut off. Assuming equal value resistances for R1, R3, R4 and R5, a high DC impedance at the base of Q2, and 0.7 volt drops across D1 and D2 when conducting, the voltage at the anodes of D1 and D2 will be 0 and 9.8 volts, respectively. The voltage at the base of Q2 will be approximately 9.1 volts. D2 will be conducting, D1 cut off and the output of the crystal oscillator coupled through D2, Q2 and T1 to the reference oscillator, resulting in injection-locked operation of that oscillator. When all the inputs to the NOR gate are at a logic ZERO level, its output, as well as the voltage at the anode of D1, will be at approximately 14 volts; Q1 will be saturated and the voltage at the anode of D2 will be at approximately ground potential. D1 will be conducting and in conjunction with C1, provide a low impedance path to ground for any component of the crystal oscillator signal that might otherwise be present at the base of Q2. However, D2 will cut off and the crystal oscillator will be effectively isolated from the reference oscillator. In this situation the operating frequency of the reference oscillator will be determined by the voltage applied to its tuning control terminal.

A particular synthesizer system using the control circuit described above, also employed a 4PDT FINE TUNE switch, one pole of which effectively disables the crystal oscillator when the FINE TUNE switch is in the ON condition. As a result, the control circuit logic is superseded and the reference oscillator operates in a voltage controlled mode even though the "UHF" or "AFC OFF" signal input to the NOR gate is at a logic ONE level. Furthermore, as indicated above, whenever the FINE TUNE switch is switched from an ON to an OFF condition, an ACQUISITION DELAY circuit generates a momentary logic ONE level signal, assuring injection-locked operation until the synthesizer PLL has achieved acquisition; this occurs even though the "UHF" and "AFC OFF" signals may be at logic ZERO level.

The examples above are intended to illustrate specific configurations of synthesizer systems in which the subject control circuit will be useful. It is clear however that this circuit will have utility in a variety of such systems. However, it is deemed especially salutary to have the reference oscillator coupled to the crystal oscillator (that is, have the reference oscillator frequency locked to the crystal oscillator frequency) during times when the synthesizer PLL is undergoing acquisition. While the invention as described herein alludes to alternate manners in which the ACQUISITION DELAY signal may be developed, it is not intended that this invention be construed as limited to those alternatives.

While there has been shown and described what are at present considered the preferred embodiments of the invention, it will be obvious to those skilled in the art that various changes and modifications may be made therein without departing from the scope of the invention as defined by the appended claims.

INDUSTRIAL APPLICABILITY

The subject control circuit is applicable to equipments such as television receivers and other communications apparatus that require selective switching of analog signals.

What is claimed is:

1. In a reference oscillator for a frequency synthesizer, the oscillator selectively capable of operation either in an injection-locked mode wherein oscillator operating frequency is determined by the frequency of a crystal-controlled oscillator or in a voltage-controlled mode wherein the oscillator operating frequency is determined by the voltage applied to the oscillator tuning voltage control terminal, the improvement comprising:
   a control circuit for selectively effecting reference oscillator operation in either the injection-locked or voltage-controlled mode, the circuit comprising:
      a logic element having an input coupled to a signal source determinative of the desired reference oscillator mode of operation, and
      an analog gate coupled to the crystal-controlled oscillator and driven by the logic element for selectively coupling the crystal-controlled oscillator to the reference oscillator to establish the injection-locked mode and for isolating the crystal-controlled oscillator from the reference oscillator to establish the voltage-controlled mode.

2. An improvement as defined in claim 1 wherein the logic element comprises:

a multiple input NOR gate having an input coupled to the source of signals determinative of the reference oscillator mode of operation and a first output coupled to an input of the analog gate; and an inverter having an input coupled to the output of the NOR gate and an output coupled to another input of the analog gate.

3. An improvement as defined in claim 1 wherein the analog gate comprises:

first diode means having one end coupled to a first output of the logic element, and second diode means having one end coupled to the other end of the first diode means and another end coupled to a second output of the logic element.

4. An improvement as defined in claim 2 wherein the analog gate comprises:

a first diode having an anode coupled to a first input of the analog gate, and a second diode having a cathode connected to the cathode of the first diode and an anode coupled to a second input of the analog gate.

5. An improvement as defined in either claim 3 or claim 4 further comprising bypassing means coupled between an input of the analog gate and a reference potential.

6. An improvement as defined in claim 2 wherein the signal source includes a signal indicative of synthesizer operation within a prescribed range of frequencies.

7. An improvement as defined in claim 2 wherein the signal source includes a logic signal indicative of reference oscillator operation in an automatic frequency control mode.

8. An improvement as defined in claim 2 wherein the signal source includes an acquisition delay signal for effecting crystal-controlled operation of the reference oscillator for a period of time sufficient to assure synthesizer acquisition subsequent to a change in the source of reference oscillator tuning voltage.

9. A control circuit for a synthesizer reference oscillator for selectively effecting operation of the oscillator in either a crystal-controlled or a voltage-controlled mode, the circuit comprising:

a logic element having multiple inputs, at least one of which is connected to a signal indicating the desired oscillator mode of operation, and outputs characterized by opposite polarities, and an analog gate having a first input coupled to an output of the logic element having one polarity and a second input coupled to an output of the logic element having the other polarity, one of the inputs adapted to be connected to a source of crystal oscillator signals so that in the crystal-controlled mode those signals appear at the output of the analog gate but are otherwise inhibited.

10. A control circuit as defined in claim 9 wherein the analog gate comprises:

first diode means having one end coupled to a A output of the logic element, and second diode means have one end coupled to a B output of the logic element, the remaining ends of the diodes being connected in common.

11. A control circuit as defined in claim 10 further comprising bypass means coupled between one end of one of the diode means and a reference potential wherein one end of the other diode means is coupled to the source of crystal oscillator signals.

12. A circuit as defined in either claim 9 or 10 wherein the logic element comprises:

a multiple-input NOR gate having an output connected to the first input of the analog gate, and an inverter having an input coupled to the output of the NOR gate and an output coupled to the second input of the analog gate.

13. A circuit as defined in claim 12 wherein one input of the NOR gate is coupled to a signal indicating operation in an AFC mode.

14. A circuit as defined in claim 12 wherein one input of the NOR gate is coupled to a signal indicating operation within a particular range of frequencies.

15. A circuit as defined in claim 12 wherein one input of the NOR gate is coupled to an acquisition delay signal so that the reference oscillator operates in the crystal-controlled mode during the time required for the synthesizer to achieve acquisition.

16. In a synthesizer system characterized by a reference oscillator selectively operable in either an injection-locked or voltage controlled mode, an improvement in the form of a control circuit for determining the reference oscillator mode of operation, the circuit comprising:

first logic means having at least one input coupled to a signal source indicative of a prescribed operating condition;

second logic means having an input coupled to an output of the first logic means; and an analog gate having:

(1) a first input coupled to the output of the first logic means;

(2) a second input coupled to the output of the second logic means;

(3) an input coupled to a source of oscillator signal; and (4) an output coupled to the reference oscillator, whereby the analog gate is driven by both logic means in response to the signal source so that the reference oscillator is coupled to the oscillator signal during the injection-locked mode.

17. An improvement as defined in claim 16 wherein the first logic means is a NOR gate and the second logic means is an inverter.

18. An improvement as defined in either claim 16 or claim 17 wherein the analog gate comprises:

first diode means coupled at one end to the output of the first logic means, and second diode means coupled at one end to the output of the second logic means, the remaining ends of the diode means coupled in common to the reference oscillator, whereby in the injection-locked mode the first diode means is in one state of conduction and the second diode means is in the opposite state of conduction.

* * * * *